(12) United States Patent
Cao et al.

(10) Patent No.: US 11,735,948 B2
(45) Date of Patent: Aug. 22, 2023

(54) BI-DIRECTIONAL MULTI-FUNCTION CONVERTER FOR BACKUP BATTERY UNIT

(71) Applicant: Baidu USA LLC, Sunnyvale, CA (US)

(72) Inventors: Yuan Cao, Sunnyvale, CA (US);
Huawei Yang, Sunnyvale, CA (US);
Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 850 days.

(21) Appl. No.: 16/523,227

(22) Filed: Jul. 26, 2019

(65) Prior Publication Data
US 2021/0028710 A1      Jan. 28, 2021

(51) Int. Cl.
| | |
|---|---|
| G06F 1/32 | (2019.01) |
| H02J 7/34 | (2006.01) |
| H02M 3/335 | (2006.01) |
| H02J 9/06 | (2006.01) |
| H02M 1/08 | (2006.01) |
| H02J 7/00 | (2006.01) |
| G06F 1/26 | (2006.01) |
| H05K 7/20 | (2006.01) |

(52) U.S. Cl.
CPC ............ *H02J 7/34* (2013.01); *G06F 1/26* (2013.01); *H02J 7/0013* (2013.01); *H02J 9/061* (2013.01); *H02M 1/08* (2013.01); *H02M 3/33584* (2013.01); *H05K 7/20754* (2013.01); *H05K 7/20781* (2013.01); *H05K 7/20836* (2013.01); *H05K 7/20909* (2013.01); *H05K 7/20927* (2013.01); *H05K 7/20945* (2013.01)

(58) Field of Classification Search
CPC .................................... G06F 1/26; G06F 1/32
See application file for complete search history.

(56) References Cited

U.S. PATENT DOCUMENTS

| | | | | |
|---|---|---|---|---|
| 11,056,906 B2* | 7/2021 | Chang | ............... | H02J 3/381 |
| 2002/0074985 A1* | 6/2002 | Matsui | ............... | H02J 7/0016 |
| | | | | 323/355 |
| 2004/0243826 A1* | 12/2004 | Wang | ............... | G06F 21/81 |
| | | | | 713/193 |

(Continued)

*Primary Examiner* — Phil K Nguyen
(74) *Attorney, Agent, or Firm* — Womble Bond Dickinson (US) LLP (57) ABSTRACT

A topology of bi-directional multi-output multi-function converter is designed in a BBU. The concept of bi-directional multi-function multi-output converter may be designed for the application of BBUs in a data center to provide multiple control functionalizes, such as battery discharging, battery charging, fan speed control, pump control, as well as providing power for multiple components/devices simultaneously. The proposed converter has two characteristics: bi-direction and multi-output. With the function of bi-direction, the battery discharging and charging can be accomplished with the same converter. With the function of multi-output, different rails of output voltages or power can be applied to different components or devices in BBU, such as fan, pump, control IC chip, sensors and etc. With the proposed concept of bi-directional multi-function multi-output converter, only one converter is required to achieve multiple control functions and provide power to different components, which reduces the volume and cost of a battery backup unit.

17 Claims, 6 Drawing Sheets

(56) References Cited

U.S. PATENT DOCUMENTS

| | | | | |
|---|---|---|---|---|
| 2005/0146223 | A1* | 7/2005 | Kanouda | H01M 50/269 307/66 |
| 2007/0290662 | A1* | 12/2007 | Lan | H02M 3/10 323/266 |
| 2008/0101096 | A1* | 5/2008 | Takayanagi | B60L 1/003 363/17 |
| 2008/0316774 | A1* | 12/2008 | Ito | B60W 10/26 363/17 |
| 2010/0250977 | A1* | 9/2010 | Huang | G06F 1/28 713/300 |
| 2011/0246795 | A1* | 10/2011 | Kuo | G06F 1/26 713/300 |
| 2013/0119768 | A1* | 5/2013 | Chang | H02J 7/34 307/66 |
| 2013/0221926 | A1* | 8/2013 | Furtner | H02J 7/0019 320/128 |
| 2013/0293018 | A1* | 11/2013 | Wu | G06F 1/305 307/66 |
| 2013/0322128 | A1* | 12/2013 | Takegami | H02M 3/33507 363/17 |
| 2014/0207305 | A1* | 7/2014 | Zhang | H02J 7/35 700/298 |
| 2015/0043256 | A1* | 2/2015 | Domingo | H02H 7/1227 363/52 |
| 2015/0180232 | A1* | 6/2015 | Mino | H02J 7/35 307/66 |
| 2015/0180233 | A1* | 6/2015 | Yamada | H02J 7/34 307/65 |
| 2017/0093162 | A1* | 3/2017 | Inoue | H02M 3/04 |
| 2017/0366011 | A1* | 12/2017 | Li | H02J 3/46 |
| 2018/0358821 | A1* | 12/2018 | Li | H02J 7/04 |
| 2021/0168964 | A1* | 6/2021 | Nakaya | H05K 7/1492 |

* cited by examiner

BI-DIRECTIONAL MULTI-FUNCTION CONVERTER FOR BACKUP BATTERY UNIT

TECHNICAL FIELD

Embodiments of the present disclosure relate generally to a backup battery unit to provide backup power. More particularly, embodiments of the disclosure relate to a backup battery unit with a bi-directional multi-function converter.

BACKGROUND

Battery energy storage as one of the energy storage methods is significant important in various applications, such as, electrical vehicles (EVs), consumer electronics, micro grids, solar and wind power, and data center backup units. It provides essential energy to support the applications either as the only source or as a backup when the main power source is not available. Thus, it is extremely important to guarantee its availability and functionality.

Figure 1:
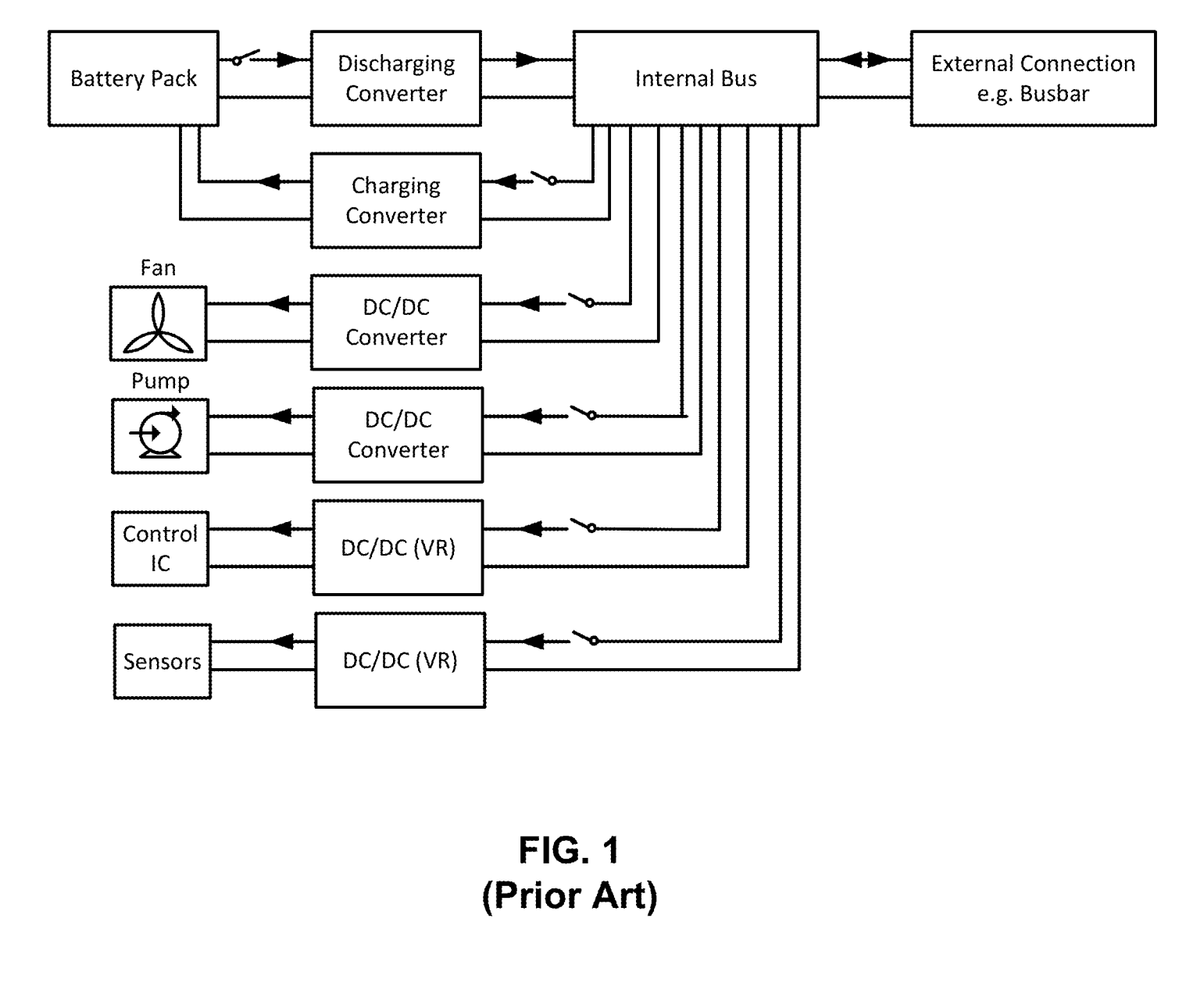
FIG. 1 shows a conventional backup power system.

A battery energy storage system (BESS) has a wide range of applications. In a BESS, as shown in FIG. 1, multiple different independent converters are used to provide power to different components or devices and perform multiple control functionalities, such as battery charging control, battery discharging control, fan speed control, and among others. However, with multiple converters in BESS, the cost and size of the system are increased.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

According to some embodiments, a topology of bi-directional multi-output multi-function converter is designed in a BBU. The concept of bi-directional multi-function multi-output converter may be designed for the application of BBUs in a data center to provide multiple control functionalizes, such as battery discharging, battery charging, fan speed control, pump control, as well as providing power for multiple components/devices simultaneously (e.g., controller chip, current sensor, voltage sensor, etc.) The proposed converter has two characteristics: bi-direction and multi-output. With the function of bi-direction, the battery discharging and charging can be accomplished with the same converter. With the function of multi-output, different rails of output voltages or power can be applied to different components or devices in BBU, such as fan, pump, control IC chip, sensors and etc. With the proposed concept of bi-directional multi-function multi-output converter, only one converter is required to achieve multiple control functions and provide power to different components, which reduces the volume and cost of a battery backup unit.

According to one aspect, a BBU includes one or more battery cells arranged in a battery pack and a bi-directional direct-current to direct current (DC/DC) converter coupled to the battery cells. The DC/DC converter includes a first terminal (e.g., a first pair of positive and negative terminals) coupled to the battery cells, a coupled inductor having a primary winding and multiple secondary windings, where the secondary windings are coupled to the secondary outputs of the converter respectively. The DC/DC converter further includes a switching device coupled to the first terminal via the primary winding of the coupled inductor and a second terminal (e.g., a second pair of positive and negative terminals) coupled to the switching device. In operations, when the second terminal is coupled to an external power supply (e.g., a power supply unit or PSU of an electronic rack), the external power supply will provide power via the second terminal to charge the battery cells and also provide power to the secondary outputs via the coupled inductor. When the external power supply is unavailable, the battery cells are discharged to provide power to a primary load (e.g., servers of the electronic rack) via the second terminal and to provide power to the secondary outputs via the coupled inductor.

In one embodiment, the DC/DC converter further includes a controller to control a duty cycle of the switching device, which in turn controls the charging current to charge the battery cells or a discharge current to discharge the battery cells. The DC/DC converter further includes a number of voltage regulators coupled between the secondary windings and their associated secondary outputs respectively to regulate the output voltages at the secondary outputs. Each secondary output further includes a rectifier coupled between the corresponding secondary winding and the voltage regulator to rectify the voltage obtained from the secondary winding.

In one embodiment, a voltage regulator can be a metal oxide semiconductor field effect transistor (MOSFET), which duty cycle can be controlled by a controller coupled to a gate terminal of the MOSFET. By controlling the duty cycle of the MOSFET, the corresponding output voltage of the secondary output can be regulated. In one embodiment, the second terminal of the DC/DC converter may be coupled to a power rail (also referred to as a busbar) of a backplane of an electronic rack, where a number of other components, such as server blades and main power supply unit (PSU), may also be coupled. The servers of the server blades may draw power from the BBU or PSU via the backplane. The secondary outputs of the DC/DC converter can provide power to other components such as sensors (e.g., temperature or liquid level sensors), fans, and/or a liquid pump for cooling purposes.

According to another aspect, an electronic rack includes a number of server blades, each having one or more servers therein to provide data process services to clients over a network. The electronic rack further includes a power supply unit to provide power to the sever blades and a backup battery unit to provide backup power to the server blades when the PSU is unavailable. The BBU includes at least some of the components and features of a BBU described above. According to a further aspect, a bi-directional DC/DC converter includes at least some of the components and features of a DC/DC converter described above.

Figure 2:
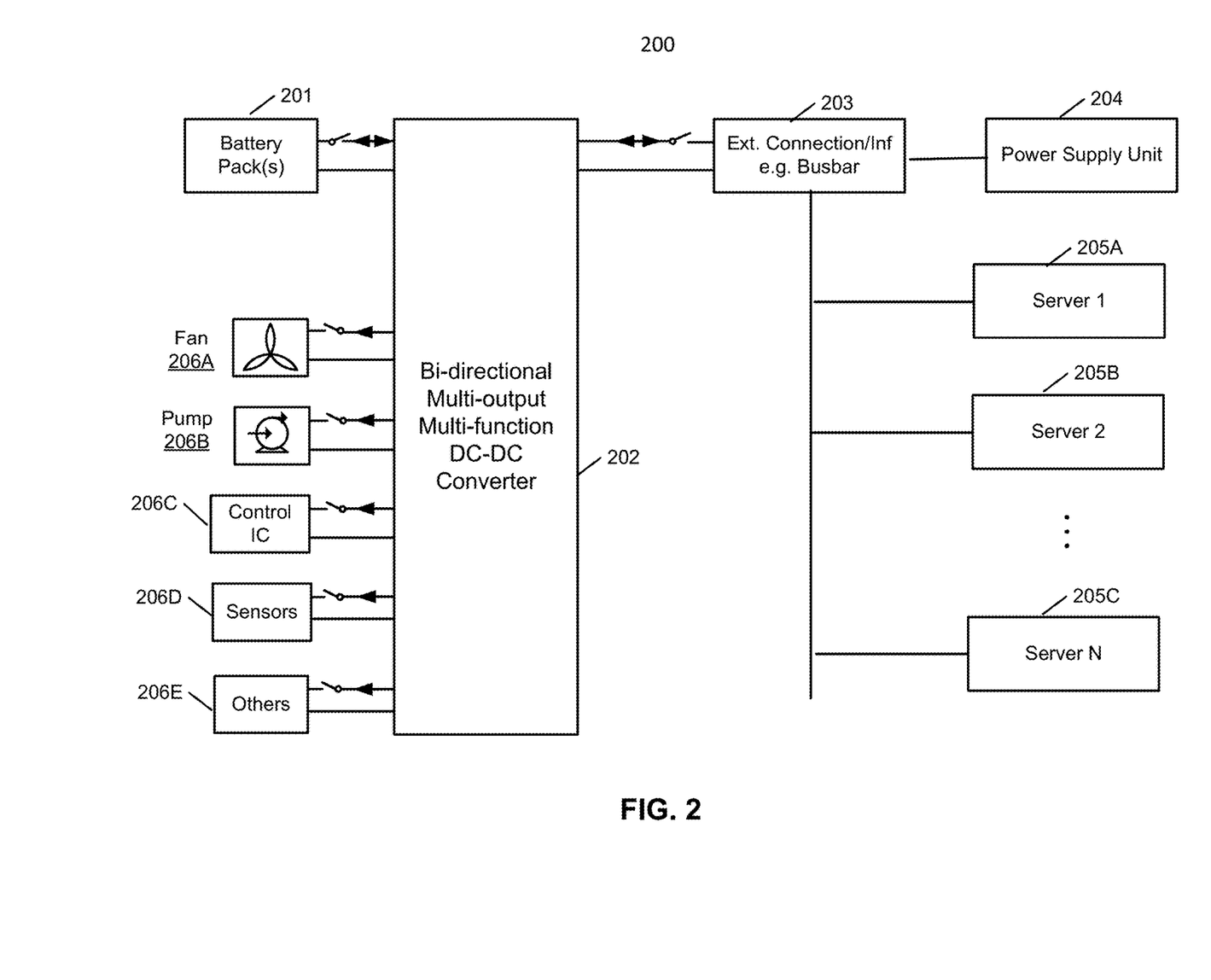
FIG. 2 is a block diagram illustrating an example of a backup power system of an electronic rack according to one embodiment.

FIG. 2 is a schematic diagram illustrating an example of a power distribution system having a bi-directional DC/DC converter therein according to one embodiment. For example, system 200 may be implemented as a part of an electronic rack having a number of servers therein of a data center. Referring to FIG. 2, data processing system includes, amongst others, one or more battery packs 201, bi-directional DC/DC converter 202 coupled to a power rail or interface circuit 203, a power supply unit (PSU) 204, and one or more power consuming components, 205A-205C, in this example, data processing servers collectively referred to as servers 205. Power rail 203 may be implemented as a part of a backplane of an electronic rack, in which PSU 204 and server blades containing servers 205 can be inserted. Battery packs 201 and DC/DC converter 202 may be implemented as a battery backup unit or BBU in a form of a battery shelf, which may also be inserted into one of the slots in the electronic rack. DC/DC converter 202 is a bidirectional DC/DC converter that can be utilized provide backup power to servers 205 and other components such as fans 206A, pump 206B, control ICs 206C, sensors 206D, and other components 206E (collectively referred to as electronic devices 206), when PSU is unavailable. DC/DC converter 202 may also operate in the other direction to provide power to charge battery packs 201 using the power obtained from PSU 204 via interface 203.

In one embodiment, DC/DC converter 202 is designed as a single converter having multiple outputs. When PSU 204 is available, DC/DC converter 202 is configured to operate in a first mode (e.g., battery charging mode) to provide power to electronic devices 206 using the power obtained from PSU 204 via interface circuit 203. PSU 204 also provides power to servers 205 via interface circuit 203. In addition, DC/DC converter 202 is configured to provide power to charge battery packs 201 using power obtained from PSU 204 via interface circuit 203. In one embodiment, when PSU 204 is unavailable, DC/DC converter 202 is configured to operate in a second mode (e.g., battery discharge mode), for example via discharge, to provide power to severs 205 and electronic devices 206. In one embodiment, DC/DC converter 202 includes a flybuck converter having multiple secondary outputs formed from multiple secondary windings of a coupled inductor to provide power to electronic devices 206, while the primary winding is coupled to a primary output to provide power to servers 205.

Figure 3:
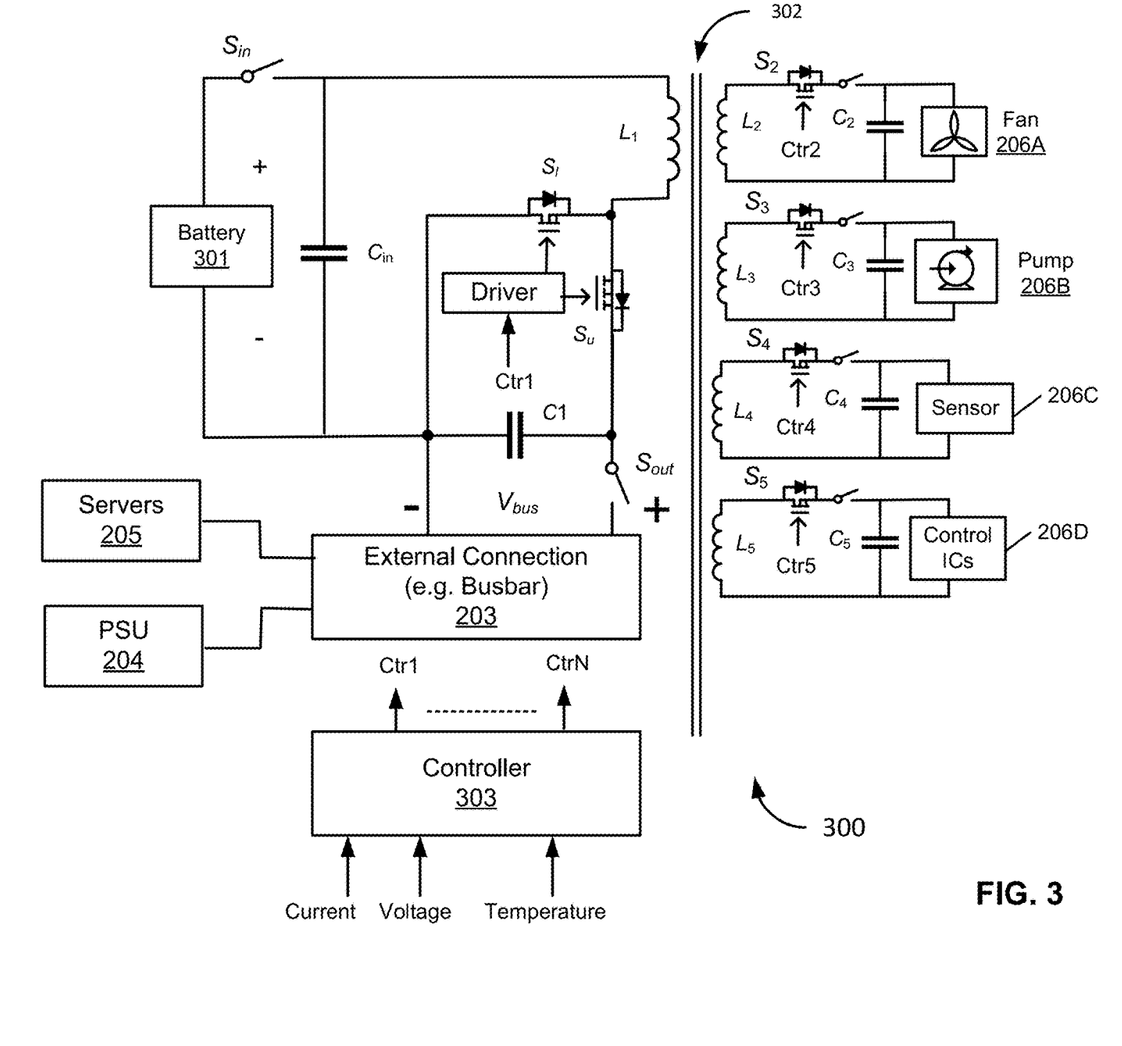
FIG. 3 is a schematic diagram illustrating an example of a backup power system having a bi-directional converter according to one embodiment.

FIG. 3 is a schematic diagram illustrating an example of a bi-directional DC/DC converter according to one embodiment. DC/DC converter 300 may represent DC/DC converter 202 of FIG. 2. Referring to FIG. 3, in one embodiment, DC/DC converter 300 includes, but is not limited to, a first terminal (e.g., a first pair of positive and negative terminals) coupled to the battery cells of battery pack 301, a coupled inductor 302 having a primary winding L1 and multiple secondary windings, in this example, L2 to L5. Although only four secondary windings are shown, more or fewer secondary windings may be implemented. In one embodiment, the secondary windings L2-L5 are coupled to the corresponding secondary outputs of the converter respectively, which may be utilized to provide power to electronic devices 206A-206D respectively.

In one embodiment, DC/DC converter 300 further includes a switching device (e.g., represented by MOSFETs Sl and Su) coupled to the first terminal (coupled to battery 301) via the primary winding L1 of the coupled inductor 302 and a second terminal (e.g., a second pair of positive and negative terminals across capacitor C1 and Vbus of interface circuit 203) coupled to the switching device. In operations, when the second terminal is coupled to an external power supply (e.g., a power supply unit or PSU of an electronic rack), the external power supply will provide power via the second terminal to charge the battery cells and also provide power to the secondary outputs via the coupled inductor. When the external power supply is unavailable, the battery cells are discharged to provide power to a primary load (e.g., servers of the electronic rack) via the second terminal and to provide power to the secondary outputs via the coupled inductor. Capacitor C1 operates as a low-pass filter to reduce noise of voltage signals during charging and discharging of battery 301.

In one embodiment, the DC/DC converter 300 further includes a controller 303 to control a duty cycle of the switching device (e.g., control signal Ctrl to switch devices Sl and Su). The duty cycle in turn controls the charging current to charge the battery cells of battery 301 or a discharge current to discharge the battery cells of battery 301. The DC/DC converter 300 further includes a number of voltage regulators S2-S5 coupled between the secondary windings L2-L5 and their associated secondary outputs 206A-206D respectively to regulate the output voltages at the secondary outputs. Each secondary output further includes a rectifier (not shown) coupled between the corresponding secondary winding and the voltage regulator to rectify the voltage obtained from the secondary winding. The rectifier may be operational as the voltage regulator may include rectifier circuit or function.

In one embodiment, a voltage regulator can be a metal oxide semiconductor field effect transistor (MOSFET), which duty cycle can be controlled by controller 303 coupled to a gate terminal of the MOSFET. By controlling the duty cycle of the MOSFET, the corresponding output voltage of the secondary output can be regulated. In one embodiment, the second terminal of the DC/DC converter may be coupled to a power rail (also referred to as a busbar) of a backplane of an electronic rack, i.e., external connection 203. Other components, such as server 205 and main power supply unit (PSU) 204 may also be coupled to the backplane. The servers 205 of the server blades may draw power from the BBU 301 or PSU 204 via the backplane. The secondary outputs 206 of the DC/DC converter 300 can provide power to other components such as sensors (e.g., temperature or liquid level sensors), fans, and/or a liquid pump for cooling purposes.

According to another aspect, an electronic rack includes a number of server blades, each having one or more servers therein to provide data process services to clients over a network. The electronic rack further includes a power supply unit to provide power to the sever blades and a backup battery unit to provide backup power to the server blades when the PSU is unavailable. The BBU includes at least some of the components and features of a BBU described above.

Figure 4A:
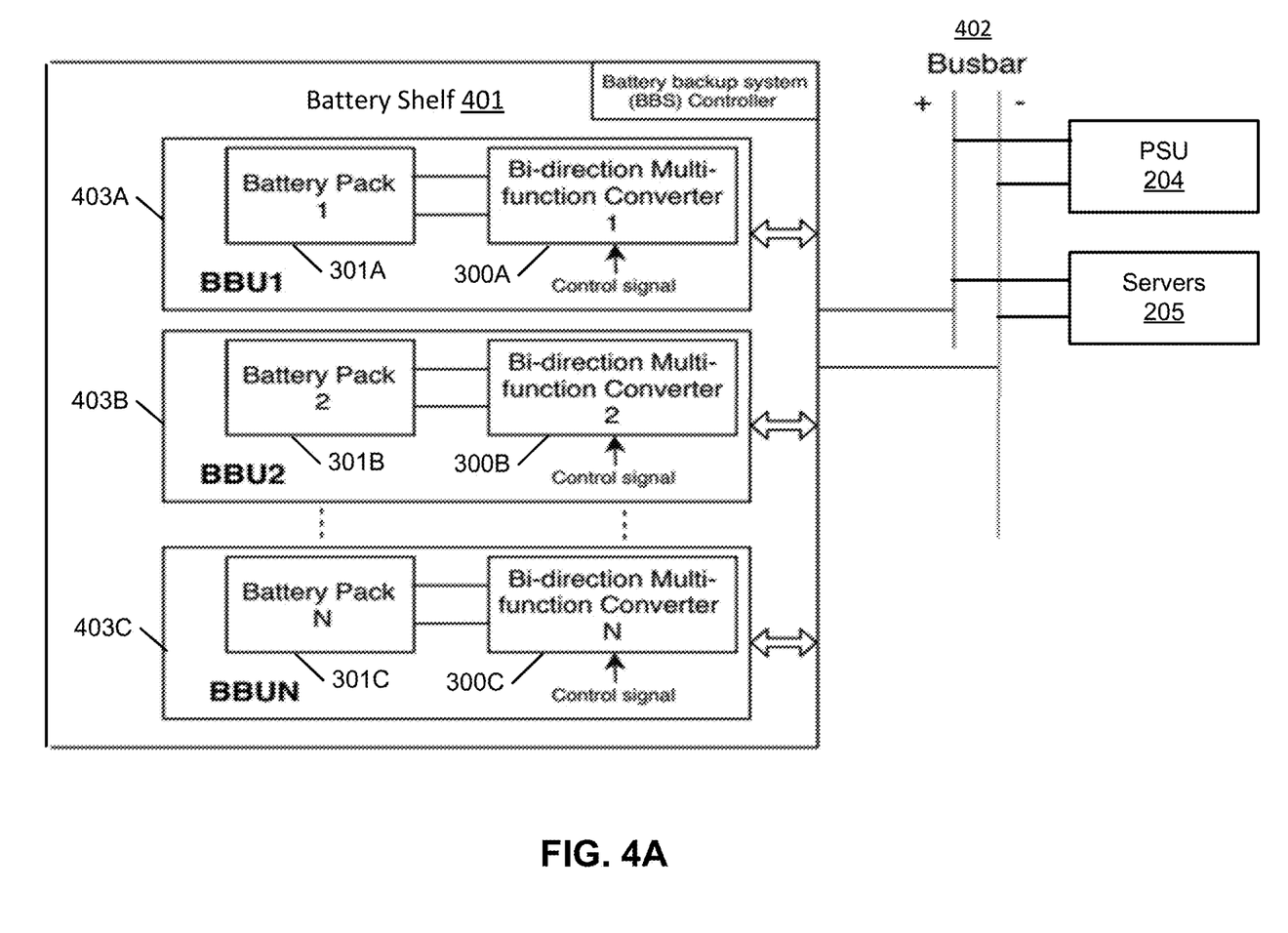
FIGS. 4A and 4B are block diagrams illustrating examples of battery shelfs of an electronic rack according to certain embodiments.
Figure 4B:
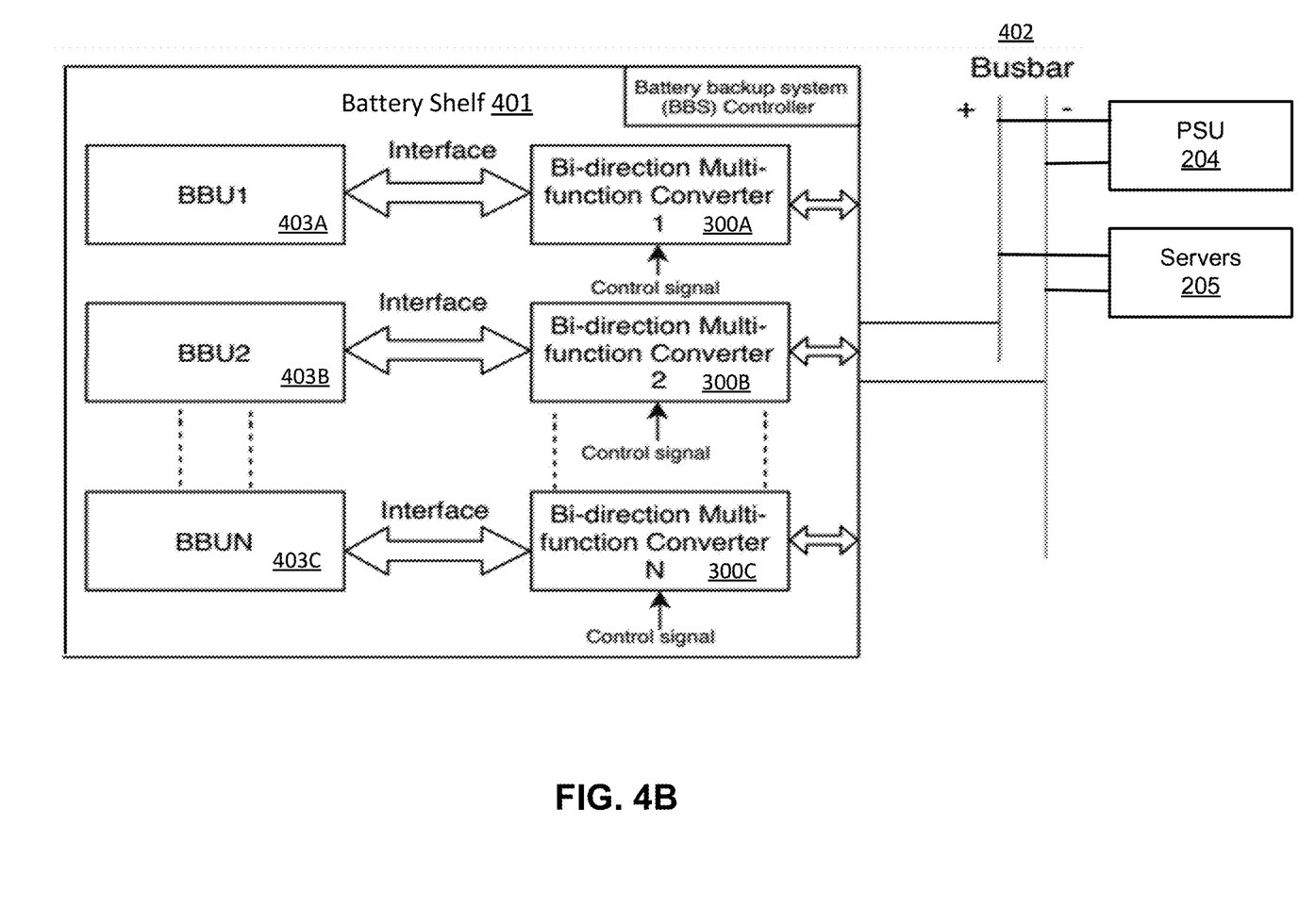

Referring now to FIG. 4A, in this example, electronic rack 400 includes a number of server blades 205 inserted into server slots, PSU 204, and battery shelf 401 coupled to backplane 402. In one embodiment, PSU 204 may be implemented as a part of battery shelf 401. Battery shelf 401 includes one or more BBUs 403A-403C (collectively referred to as BBUs 403). Each of BBUs 403 includes a battery pack (e.g., battery packs 301A-301C) and a bi-directional DC/DC converter (DC/DC converters 300A-300C) as described above. In this example, the bi-directional DC/DC converters 300 are implemented within BBUs 403. Alternatively, the bi-directional DC/DC converters 300 are implemented external to BBUs 403 via interface circuit as shown in FIG. 4B.

Figure 5:
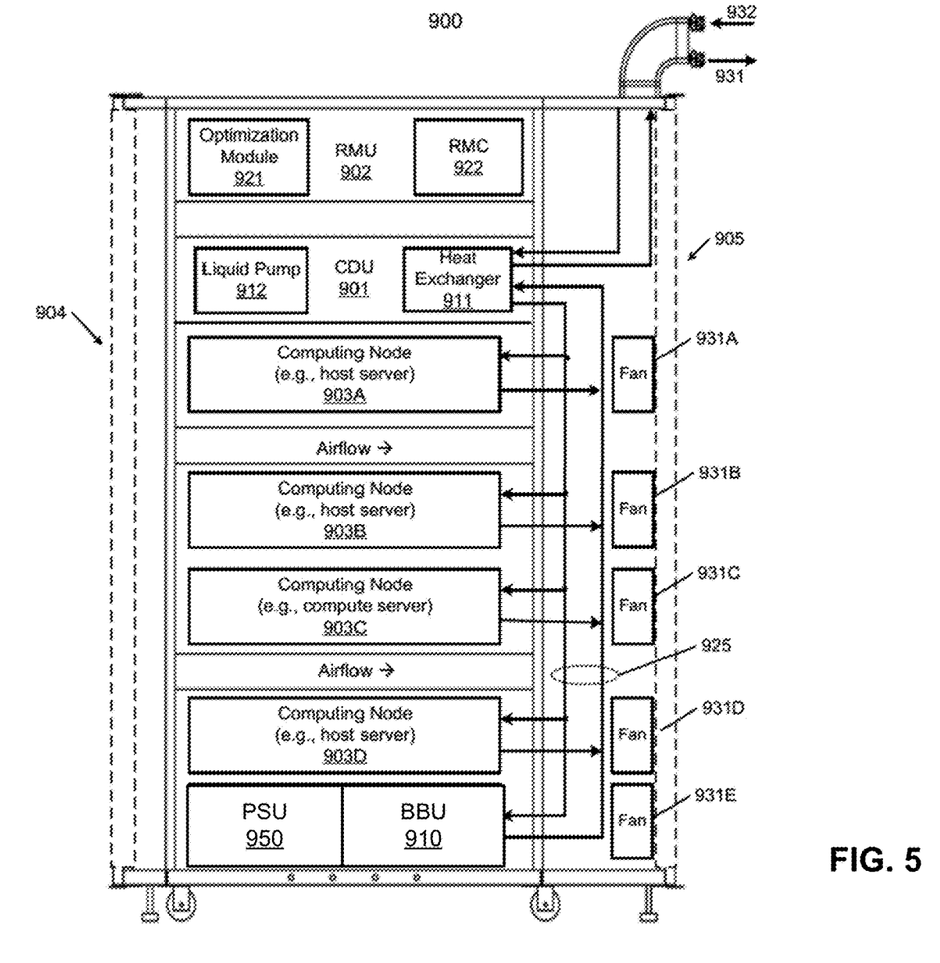
FIG. 5 shows an example of an electronic rack containing a backup battery pack according to one embodiment.

FIG. 5 is a block diagram illustrating an example of an electronic rack according to one embodiment. Electronic rack 900 may include one or more server slots to contain one or more servers respectively. Each server includes one or more information technology (IT) components (e.g., processors, memory, storage devices, network interfaces). Referring to FIG. 5, according to one embodiment, electronic rack 900 includes, but is not limited to, CDU 901, rack management unit (RMU) 902 (optional), a power supply unit (PSU) 950, a BBU 910, and one or more server blades 903A-903D (collectively referred to as server blades 903). Server blades 903 can be inserted into an array of server slots respectively from frontend 904 or backend 905 of electronic rack 900. The PSU 950 and/or BBU 910 may be inserted into any of server slots 903 within the electronic rack 900, where PSU 950 and BBU 910 may be implemented as a power shelf or alternatively, PSU 950 is implemented as a power shelf and BBU 910 is implemented as a battery shelf as described above.

Note that although there are only four server blades 903A-903D shown here, more or fewer server blades may be maintained within electronic rack 900. Also note that the particular positions of CDU 901, RMU 902, PSU 950, BBU 910, and server blades 903 are shown for the purpose of illustration only; other arrangements or configurations of CDU 901, RMU 902, BBU 910, and server blades 903 may also be implemented. Note that electronic rack 900 can be either open to the environment or partially contained by a rack container, as long as the cooling fans can generate airflows from the frontend to the backend.

In addition, a fan module can be associated with each of the server blades 903, and BBU 910. In this embodiment, fan modules 931A-931E, collectively referred to as fan modules 931, and are associated with server blades 903A-903D and BBU 910 respectively. Each of the fan modules 931 includes one or more cooling fans. Fan modules 931 may be mounted on the backends of server blades 903 and BBU 910 to generate airflows flowing from frontend 904, traveling through the air space of the sever blades 903, and existing at backend 905 of electronic rack 900.

In one embodiment, CDU 901 mainly includes heat exchanger 911, liquid pump 912, and a pump controller (not shown), and some other components such as a liquid reservoir, a power supply, monitoring sensors and so on. Heat exchanger 911 may be a liquid-to-liquid heat exchanger. Heat exchanger 911 includes a first loop with inlet and outlet ports having a first pair of liquid connectors coupled to external liquid supply/return lines 931-932 to form a primary loop. The connectors coupled to the external liquid supply/return lines 931-932 may be disposed or mounted on backend 905 of electronic rack 900. The liquid supply/return lines 931-932 are coupled to a set of room manifolds, which are coupled to an external heat removal system, or extremal cooling loop. In addition, heat exchanger 911 further includes a second loop with two ports having a second pair of liquid connectors coupled to liquid manifold 925 to form a secondary loop, which may include a supply manifold to supply cooling liquid to server blades 903 and a return manifold to return warmer liquid back to CDU 901. Note that CDUs 901 can be any kind of CDUs commercially available or customized ones. Thus, the details of CDUs 901 will not be described herein. As an example, cooling device 108 shown in FIG. 7 may connect to 925 to complete a full fluid loop.

Each of server blades 903 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling devices as described above. Server blades 903 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronic rack 900 further includes optional RMU 902 configured to provide and manage power supplied to servers 903, fan modules 931, and CDU 901. Optimization module 921 and RMC 922 can communicate with a controller in some of the applications. RMU 902 may be coupled to power supply unit 950 to manage the power consumption of the power supply unit. The power supply unit 950 may include the necessary circuitry (e.g., an alternating current (AC) to direct current (DC) or DC to DC power converter, backup battery, transformer, or regulator, etc.) to provide power to the rest of the components of electronic rack 900.

In one embodiment, RMU 902 includes optimization module 921 and rack management controller (RMC) 922. RMC 922 may include a monitor to monitor operating status of various components within electronic rack 900, such as, for example, computing nodes 903, CDU 901, and fan modules 931. Specifically, the monitor receives operating data from various sensors representing the operating environments of electronic rack 900. For example, the monitor may receive operating data representing temperatures of the processors, cooling liquid, and airflows, which may be captured and collected via various temperature sensors. The monitor may also receive data representing the fan power and pump power generated by the fan modules 931 and liquid pump 912, which may be proportional to their respective speeds. These operating data are referred to as real-time operating data. Note that the monitor may be implemented as a separate module within RMU 902.

Based on the operating data, optimization module 921 performs an optimization using a predetermined optimization function or optimization model to derive a set of optimal fan speeds for fan modules 931 and an optimal pump speed for liquid pump 912, such that the total power consumption of liquid pump 912 and fan modules 931 reaches minimum, while the operating data associated with liquid pump 912 and cooling fans of fan modules 931 are within their respective designed specifications. Once the optimal pump speed and optimal fan speeds have been determined, RMC 922 configures liquid pump 912 and cooling fans of fan modules 931 based on the optimal pump speed and fan speeds.

As an example, based on the optimal pump speed, RMC 922 communicates with a pump controller of CDU 901 to control the speed of liquid pump 912, which in turn controls a liquid flow rate of cooling liquid supplied to the liquid manifold 925 to be distributed to at least some of server blades 903. Therefore, the operating condition and the corresponding cooling device performance are adjusted. Similarly, based on the optimal fan speeds, RMC 922 communicates with each of the fan modules 931 to control the speed of each cooling fan of the fan modules 931, which in turn control the airflow rates of the fan modules 931. Note that each of fan modules 931 may be individually controlled with its specific optimal fan speed, and different fan modules and/or different cooling fans within the same fan module may have different optimal fan speeds. According to one embodiment, BBU 910 can be implemented as any of the BBUs described above as shown in FIGS. 1-3.

Note that some or all of the IT components of servers 903 may be attached to any one of the cooling devices described above, either via air cooling using a heatsink or via liquid cooling using a cold plate. One server may utilize air cooling while another server may utilize liquid cooling. Alternatively, one IT component of a server may utilize air cooling while another IT component of the same server may utilize liquid cooling. In addition, a switch is not shown here, which can be either air cooled or liquid cooled.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A backup battery unit (BBU) to provide backup power, the BBU comprising:
   one or more battery cells arranged in a battery pack; and
   a bi-directional direct-current to direct-current (DC/DC) converter coupled to the battery cells, wherein the bi-directional DC/DC converter comprises:
      a first terminal coupled to the battery cells;
      a coupled inductor having a primary winding coupled to the battery cells and a plurality of secondary windings coupled to a plurality of secondary outputs respectively, wherein the primary winding comprises a first side and a second side;
      a switching device comprising a first side and a second side, wherein the first side of the switching device couples directly to the first side of the primary winding, and wherein the second side of the primary winding couples directly to the first terminal;
      a second terminal coupled directly to the second side of the switching device, wherein when the second terminal is coupled to an external power supply, the external power supply is configured via the second terminal to charge the battery cells of the battery pack and to provide power to the secondary outputs via the coupled inductor, and wherein when the external power supply is unavailable, the battery cells are discharged to provide power to a primary load external to the BBU via the second terminal and to provide power to the secondary outputs via the coupled inductor; and
      a controller configured to control a duty cycle of the switching device, which in turn controls a charging current to charge the battery cells or a discharge current to discharge the battery cells.

2. The BBU of claim 1, wherein the bi-directional DC/DC converter further comprises a plurality of voltage regulators coupled between the secondary windings and the secondary outputs to regulate output voltages at the secondary outputs respectively.

3. The BBU of claim 2, wherein the bi-directional DC/DC converter further comprises a plurality of rectifiers coupled between the secondary windings and the voltage regulators to rectify voltages obtained from the secondary windings.

4. The BBU of claim 2, wherein each of the voltage regulators comprises a metal oxide semiconductor field effect transistor (MOSFET).

5. The BBU of claim 4, wherein the bi-directional DC/DC converter further comprises a controller coupled to a gate of each MOSFET to control a duty cycle of the MOSFET, which in turn regulates an output voltage of the corresponding secondary output.

6. The BBU of claim 1, wherein the second terminal is to be coupled to a backplane of an electronic rack having an array of computer servers to draw power from the backplane either from the BBU or an external power supply coupled to the backplane.

7. The BBU of claim 6, wherein the secondary outputs are to provide power to a cooling fan for air cooling or a liquid pump for liquid cooling of the electronic rack.

8. The BBU of claim 7, wherein at least one of the secondary output is coupled to a temperature sensor sensing a temperature of the electronic rack, which is utilized to determine whether to turn on the cooling fan for air cooling or the liquid pump for liquid cooling.

9. An electronic rack of a data center, comprising:
   a plurality of server blades arranged in a stack, each server blade including one or more servers to provide data processing services;
   a power supply coupled to the server blades to provide power to operate the servers; and
   a backup battery unit (BBU) coupled to the server blades to provide backup power to the servers when the power supply is unable to provide power, wherein the BBU comprises:
      one or more battery cells arranged in a battery pack; and
      a bi-directional direct-current to direct-current (DC/DC) converter coupled to the battery cells, wherein the bi-directional DC/DC converter comprises:
         a first terminal coupled to the battery cells;
         a coupled inductor having a primary winding coupled to the battery cells and a plurality of secondary windings coupled to a plurality of secondary outputs respectively, wherein the primary winding comprises a first side and a second side;

a switching device comprising a first side and a second side, wherein the first side of the switching device couples directly to the first side of the primary winding, and wherein the second side of the primary winding couples directly to the first terminal;

a second terminal coupled directly to the second side of the switching device, wherein when the second terminal is coupled to an external power supply, the external power supply is configured via the second terminal to charge the battery cells of the battery pack and to provide power to the secondary outputs via the coupled inductor, and wherein when the external power supply is unavailable, the battery cells are discharged to provide power to the server blades external to the BBU via the second terminal and to provide power to the secondary outputs via the coupled inductor; and a controller configured to control a duty cycle of the switching device, which in turn controls a charging current to charge the battery cells or a discharge current to discharge the battery cells.

10. The electronic rack of claim 9, wherein the bi-directional DC/DC converter further comprises a plurality of voltage regulators coupled between the secondary windings and the secondary outputs to regulate output voltages at the secondary outputs respectively.

11. The electronic rack of claim 10, wherein the bi-directional DC/DC converter further comprises a plurality of rectifiers coupled between the secondary windings and the voltage regulators to rectify voltages obtained from the secondary windings.

12. The electronic rack of claim 10, wherein each of the voltage regulators comprises a metal oxide semiconductor field effect transistor (MOSFET).

13. The electronic rack of claim 12, wherein the bi-directional DC/DC converter further comprises a controller coupled to a gate of each MOSFET to control a duty cycle of the MOSFET, which in turn regulates an output voltage of the corresponding secondary output.

14. The electronic rack of claim 9, wherein the second terminal is to be coupled to a backplane of the electronic rack, wherein the servers to draw power from the backplane either from the BBU or an external power supply coupled to the backplane.

15. The electronic rack of claim 14, wherein the secondary outputs are to provide power to a cooling fan for air cooling or a liquid pump for liquid cooling of the electronic rack.

16. The electronic rack of claim 15, wherein at least one of the secondary output is coupled to a temperature sensor sensing a temperature of the electronic rack, which is utilized to determine whether to turn on the cooling fan for air cooling or the liquid pump for liquid cooling.

17. A bi-directional DC/DC converter,
comprising: a first terminal to be coupled to one or more battery cells;

a coupled inductor having a primary winding coupled to the battery cells and a plurality of secondary windings coupled to a plurality of secondary outputs respectively, wherein the primary winding comprises a first side and a second side;

a switching device comprising a first side and a second side, wherein the first side of the switching device couples directly to the first side of the primary winding, and wherein the second side of the primary winding couples directly to the first terminal;

a second terminal coupled directly to the second side of the switching device, wherein when the second terminal is coupled to an external power supply, the external power supply is configured via the second terminal to charge the battery cells of the battery pack and to provide power to the secondary outputs via the coupled inductor, and wherein when the external power supply is unavailable, the battery cells are discharged to provide power to a primary load external to the bi-directional DC/DC converter via the second terminal and to provide power to the secondary outputs via the coupled inductor; and a controller configured to control a duty cycle of the switching device, which in turn controls a charging current to charge the battery cells or a discharge current to discharge the battery cells.

* * * * *